US010411072B2

(12) United States Patent
Bernasconi et al.

(10) Patent No.: US 10,411,072 B2
(45) Date of Patent: Sep. 10, 2019

(54) METHOD FOR PRODUCING A RESISTIVE MEMORY CELL

(71) Applicant: Commissariat A L'Energie Atomique et aux Energies Alternatives, Paris (FR)

(72) Inventors: Sophie Bernasconi, Laval (FR); Christelle Charpin-Nicolle, Fontanil-Cornillon (FR); Anthony De Luca, Claix (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 177 days.

(21) Appl. No.: 15/281,813

(22) Filed: Sep. 30, 2016

(65) Prior Publication Data

US 2017/0162627 A1    Jun. 8, 2017

(30) Foreign Application Priority Data

Sep. 30, 2015 (FR) ...................................... 15 59316

(51) Int. Cl.
*H01L 45/00* (2006.01)
*H01L 27/24* (2006.01)

(52) U.S. Cl.
CPC .......... *H01L 27/2463* (2013.01); *H01L 45/04* (2013.01); *H01L 45/08* (2013.01); *H01L 45/085* (2013.01); *H01L 45/1233* (2013.01); *H01L 45/1253* (2013.01); *H01L 45/146* (2013.01); *H01L 45/16* (2013.01)

(58) Field of Classification Search
CPC ........................ H01L 27/2422; H01L 45/1273
See application file for complete search history.

(56) References Cited

U.S. PATENT DOCUMENTS

| 4,845,533 A |   | 7/1989 | Pryor et al. |   |
|---|---|---|---|---|
| 7,910,911 B2 | * | 3/2011 | Breitwisch | H01L 45/06 257/4 |
| 7,911,030 B2 | * | 3/2011 | Chung | H01L 45/08 257/295 |

(Continued)

FOREIGN PATENT DOCUMENTS

| EP | 0 269 225 A2 | 6/1988 |
| FR | 2 998 708 | 11/2012 |

OTHER PUBLICATIONS

Extended European Search Report dated Feb. 23, 2017 in Patent Application No. 16191723.2 (with English translation of categories of cited documents).

(Continued)

*Primary Examiner* — Benjamin P Sandvik
(74) *Attorney, Agent, or Firm* — Oblon, McClelland, Maier & Neustadt, L.L.P.

(57) ABSTRACT

A method for manufacturing a memory cell includes forming a stack of layers comprising a first electrode and a dielectric layer, and forming a second electrode. Forming the second electrode includes depositing the second electrode on the dielectric layer, and defining the contour of the second electrode in such a way that the second electrode forms a protruding element above the dielectric layer having inclined flanks, the angle between the flanks of the second electrode forming an acute angle with the plane wherein the dielectric layer mainly extends.

23 Claims, 3 Drawing Sheets

(56) References Cited

U.S. PATENT DOCUMENTS

| | | | |
|---|---|---|---|
| 8,345,463 B2* | 1/2013 | Lee | H01L 45/1233 365/148 |
| 8,377,789 B2 | 2/2013 | Meijer et al. | |
| 8,470,681 B2 | 6/2013 | Rossel et al. | |
| 8,598,562 B2* | 12/2013 | Sills | H01L 45/04 257/4 |
| 9,385,315 B2* | 7/2016 | Sills | H01L 45/04 |
| 2008/0278989 A1* | 11/2008 | Lee | G11C 13/0007 365/148 |
| 2009/0032793 A1* | 2/2009 | Lai | H01L 45/06 257/4 |
| 2009/0278109 A1* | 11/2009 | Phatak | H01L 45/08 257/4 |
| 2010/0019240 A1* | 1/2010 | Lee | H01L 45/1233 257/43 |
| 2010/0175053 A1* | 7/2010 | Jansseune | G06F 9/44557 717/133 |
| 2011/0020998 A1 | 1/2011 | Oh et al. | |
| 2011/0143477 A1* | 6/2011 | Lee | H01L 27/2409 438/54 |
| 2011/0180796 A1* | 7/2011 | Yamazaki | H01L 29/7869 257/57 |
| 2013/0001501 A1* | 1/2013 | Sills | H01L 45/04 257/4 |
| 2013/0112936 A1* | 5/2013 | Wei | H01L 45/08 257/4 |
| 2014/0138608 A1 | 5/2014 | Sills | |
| 2014/0145141 A1 | 5/2014 | Molas et al. | |
| 2014/0339550 A1 | 11/2014 | Shimoda et al. | |
| 2015/0001456 A1* | 1/2015 | Banno | H01L 45/085 257/4 |
| 2015/0200364 A1 | 7/2015 | Sills | |
| 2015/0236257 A1* | 8/2015 | Walls | H01L 45/1273 257/3 |
| 2015/0340606 A1* | 11/2015 | Tada | G11C 13/0002 257/4 |

OTHER PUBLICATIONS

French Preliminary Search Report and Written Opinion dated Aug. 10, 2016 in French Application 15 59318, filed on Sep. 30, 2016, (with English Translation of Categories of cited documents).

* cited by examiner

METHOD FOR PRODUCING A RESISTIVE MEMORY CELL

FIELD OF THE INVENTION

This invention relates to, in general, a resistive memory cell, and more particularly, a non-volatile resistive memory cell and method for the manufacture thereof.

TECHNOLOGICAL BACKGROUND

Resistive memories of the OxRRAM type (acronym for "Oxide-Based Resistive Random Access Memories") typically comprising a metal oxide layer, are preferentially chosen for non-volatile applications, with the purpose of replacing memories of the Flash type. They in particular have the advantage of being compatible with the end of line method (acronym BEOL for "Back-End Of Line") of the CMOS technology (acronym for "Complementary Metal-Oxide-Semiconductor").

OxRRAM resistive memories are devices that in particular include a metal oxide layer arranged between two electrodes. The electrical resistance of such devices can be modified by write and erase operations. These write and erase operations make it possible to switch the OxRAM resistive memory device from an LRS (acronym for "Low Resistive State") to an HRS (acronym for "High Resistive State"), and inversely.

During programming steps, i.e. when sufficient voltage and current are applied to the device, with a limitation for the current passing through the device, less, for example, than a few milliamperes (mA), conductive filaments can be created selectively (LRS state) and be broken (HRS state) between the electrodes through the oxide layer.

From cycle to cycle, the resistances of the low resistance LRS and high resistance HRS states tend to change. A variability in these LRS and HRS resistances is therefore observed during the life of these memory cells.

This variability is also observed from cell to cell.

This variability is particularly substantial for the high resistance state HRS, inducing a decrease in the programming window, even a total loss of the programming window. This variability problem is today a real barrier for industrialization.

This concern remains despite many efforts made in the field of methods for manufacturing resistive memories and programming methods.

Moreover, many studies have been conducted in order to reduce the variability of the electrical performance by reducing the contact surface between one of the electrodes and the oxide layer.

In particular, it has been shown in the publication: "Conductive Filament Control in Highly Scalable Unipolar Resistive Switching Devices for Low-Power and High-density Next Generation Memory", Kyung-Chang Ryoo et al., IEDM2013, that a solution for reducing the dimensions of the device is to reduce the contact surface between one of the electrodes and the oxide layer. This solution involves complex and expensive methods of implementation.

Document U.S. Pat. No. 8,470,681 proposes to add a disturbing element in the oxide layer and on the lower electrode, in such a way as to favor the forming of a conductive filament on the zone where the disturbing element is located. The adding of this element generates a field of constraints that are more substantial in the device. In this same document, another embodiment consists is creating a shape of a cone or pyramid in the lower electrode, before proceeding with the deposition of the oxide layer.

These solutions have for disadvantages to add many steps in the manufacture of the device. Moreover these steps are complex and it is not easy to achieve good reproducibility.

Moreover, the reduction in the surface of the upper electrode renders tapping complex on this electrode.

Document FR2998708 proposes to minimize the dimensions of the memory point formed by the material inside of which the conductive filament is created between the two electrodes of the memory cell CBRAM. The invention primarily relates to 37 ionic conductive memories (CBRAM memories or "Conductive Bridging RAM", but can be extended to other types of memories. It requires several levels of lithography. One of the technological sequences proposed is the following: creation of a metal line, creation of an inert lower electrode, for example, via a damascene method, creation of a confinement electrode comprising a soluble material, deposition of a dielectric, creation of an additional via by lithography, creation of spacers (deposition, etching), filling with a material, chemical-mechanical polishing, then another deposition of a dielectric layer, creation of a via by lithography, creation of spacers and filling with a material. The objective is to create a point effect on the upper electrode, but to retain a sufficient volume of electrolyte (CBRAM applications). Document U.S. Pat. No. 8,377,789 aims for the same objective be seeking a point effect on the transition metal oxide.

Disadvantages appear in this type of device. First of all, problems can arise during the filling of via, in particular when aiming for minimizing dimensions. Moreover, the method for manufacturing such devices is difficult to implement in terms of technological production and reproducibility.

As such in all of the known solutions, in order to form a reduced contact surface between at least one of the electrodes and the oxide layer, it is necessary have recourse to multiple and therefore expensive steps. In particular, the steps of lithography, of deposition, of planarization, required in order to obtain nanometric dimensions on contacts between the electrodes and the dielectric material of the oxide layer are complex and require complex development steps that are not always perfectly reproducible. Moreover, a tapping carried out on a small surface inevitably results in additional constraints on industrialization.

This invention aims to overcome all or, at least, a portion of the disadvantages of current techniques. It would be in particular advantageous to propose a solution to reduce, even suppress, the variability in the HRS and/or LRS resistances observed cycle after cycle for resistive memory devices, while still limiting or avoiding the disadvantages of the known production methods of prior art mentioned hereinabove.

SUMMARY OF THE INVENTION

This invention relates to a method for manufacturing a resistive memory cell from a stack of layers comprising at least one first electrode and a dielectric layer surmounting the first electrode.

The method comprises a step of forming a second electrode comprising at least one step of deposition of the second electrode on the dielectric layer, a step of defining the contour of said second electrode, in such a way that the second electrode forms a protruding element above the dielectric layer having flanks, and preferably at least two adjacent, curved or inclined flanks with respect to the perpendicular to a plane wherein the dielectric layer mainly extends.

The method of this invention makes it possible to produce a memory cell by using simple steps of lithography and etching of the second electrode. Instead of minimizing as much as possible the dimensions of the dielectric layer inside of which the conductive filament is formed or is deformed to switch alternatively from LRS and HRS states, the invention provides for conventional steps of lithography (advantageously a deep UV lithography), less costly in order to reduce the dimensions of one of the two electrodes. The constraints on the dimensions are as such released. The step of etching advantageously makes it possible to minimize the size of the "active" zone of a resistive memory of the Ox-RAM type. Moreover, the surface S2 does not have to be very small which favors tapping on the second electrode.

This invention as such proposes a simple, reliable and reproducible method, that makes it possible to release the constraints on the tapping at the top of the memory point (no expensive lithography step), while still minimizing the effective zone of formation of the conductive filament.

This invention also relates to a memory cell or memory device comprising a stack of layers comprising a first electrode, a second electrode and a dielectric layer positioned between the first electrode. The second electrode forms a protruding element above the dielectric layer. This protruding element has inclined flanks with respect to the perpendicular to a plane wherein the dielectric layer mainly extends or curves in such a way that the protruding element defines a first surface S1 facing the dielectric layer and a second surface S2, opposite the first, the first surface S1 being less than the second surface S2.

This invention also relates to a memory cell comprising a stack of layers comprising a first electrode and a dielectric layer. A second electrode, positioned on the dielectric layer, is configured in such a way as to former a protruding element above the dielectric layer having inclined flanks, with the angle α between the flanks of the second electrode forming an acute angle with the plane wherein the dielectric layer mainly extends.

Particularly advantageously, the flanks of the protruding element forming the second electrode are curved or inclined. To do this, an etching standard is carried out comprising an over-etching of the second electrode in such a way as to form a protruding element of which the profile is substantially concave or receding trapezoidal. This approach forming inclined flanks, is not standard. Indeed, in microelectronic devices, it is generally sought to obtain profiles that are as straight as possible or with an "extending" slope (so that the depositions carried out afterwards are conformal).

Advantageously, in order to reduce the cycle-after-cycle instability observed in the memory cell, this invention makes it possible to reduce the contact surface between the at least one electrode among the first and second electrodes and the dielectric layer. The more reduced the contact surface between one of the electrodes and the dielectric layer is, the more the conductive filament will be guided in its growth, the more reproducible the electrical characteristics will be.

When the contact surface between the at least one electrode among the first electrode and the second electrode and the dielectric layer is substantial, the number of parasitic paths of conductive filaments that can be created during the programming steps is high, which can generate substantial variability in the cycle-to-cycle and/or cell-to-cell performance.

This invention does not require an adjustment of the thickness of the dielectric layer. Advantageously, the dielectric layer sera "intact" and not modified by the chemical etching used during later steps of the method. As such, this invention presents an alternative solution that does not require a modification in the manufacture of the memory cell following an adjustment of the dielectric layer.

The method according to this invention makes it possible to reduce the "active" surface of the memory point, advantageously by a factor of 1000 (for example, from 100 nanometers to 10 nanometers in lateral dimensions), while still making it possible to create the memory point by using released lithography techniques (for example conventional deep ultraviolet lithography, and not giving rise to any specific problem during the tapping on the upper via. In the same way, standard optical lithography techniques can be used, with alignments ("overlay"), on the memory point, not critical. The method is, moreover, easy to implement, as it does not require expensive and difficult levels of lithography.

Another object of this invention relates to a microelectronics device comprising a plurality of memory cells according to the invention. The term microelectronic device refers to any type of device carried out with microelectronic means. These devices encompass in particular in addition to devises with a purely electronic purpose, micromechanical or electromechanical devices (MEMS, NEMS . . . ) as well as optical or opto-electronic devices (MOEMS . . . )

BRIEF INTRODUCTION OF THE FIGURES

Other characteristics, purposes and advantages of this invention shall appear when reading the following detailed description, with regards to the annexed drawings, provided as a non-limiting example, and whereon FIGS. 1 to 5 each show a step of an example of the method of manufacturing this invention:

Figure 1:
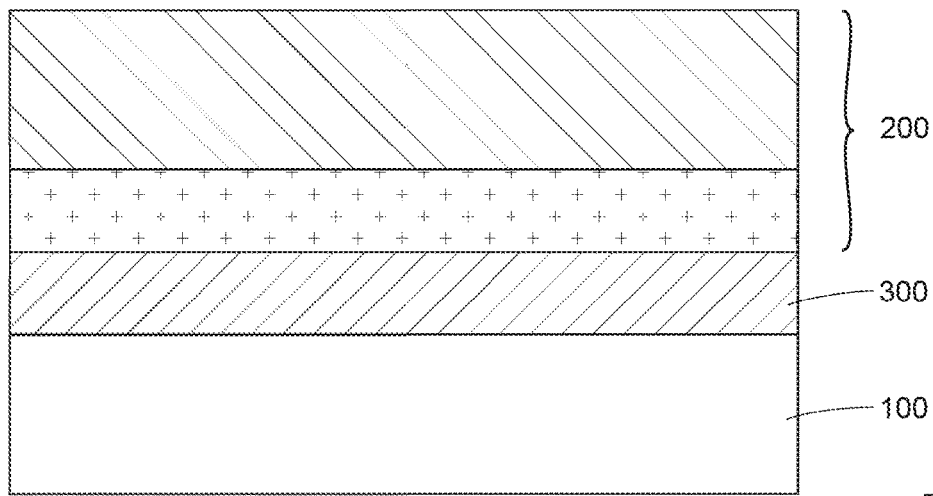
FIG. 1 shows a cross-section view of a step of deposition of a stack of layers forming a memory cell, comprising a dielectric layer arranged between two electrodes.

The drawings are given by way of examples and do not limit the invention. They constitute diagrammatical block representations intended to facilitate the understanding of the invention and are not necessarily to scale of the practical applications. In particular, the relative thicknesses of the various layers and substrates may not be representative of reality.

DETAILED DESCRIPTION

Before beginning a detailed review of embodiments of the invention, optional characteristics are announced hereinafter that can possibly be used according to any association or alternatively:

The step of defining the contour is carried out in such a way that the contour is inclined, and more preferably entirely inclined, in relation to a direction perpendicular to the main plane wherein the dielectric layer extends.

The second electrode comprises at least two adjacent inclined flanks with respect to the perpendicular to a plane wherein the dielectric layer mainly extends.

The second electrode comprises at least four adjacent inclined flanks with respect to the perpendicular to a plane wherein the dielectric layer mainly extends.

The second electrode comprises a continuous circular contour forming a truncated cone of which the smallest base is turned facing and preferably in contact with the dielectric layer.

The second electrode forms a protruding element with a polygon base, for example square or rectangular. According to another embodiment, the second electrode forms a protruding circular element. The shape of this base is defined by the shape of the face of the protruding element turned facing or in contact with the dielectric layer.

The second surface S2 forms a tapping for the second electrode.

The step of defining the contour of the second electrode is carried out in such a way that the protruding element defines a first surface S1 facing the dielectric layer and a second surface S2, opposite the first, the first surface S1 being less than the second surface S2; said surfaces S1, S2 extending substantially parallel to the plane wherein the dielectric layer mainly extends. As such, S1, S2 extends perpendicularly to the thickness of the dielectric layer. This step comprises at least one etching.

The step of defining comprises an etching carried out in such a way as to define the inclined flanks and the surfaces S1 and S2.

The step of defining comprises an etching according to a dimension with the thickness of the second electrode. In other words, the step of defining comprises an anisotropic etching.

The etching is at least partially isotropic.

The etching comprises a chemical phase, preferably chosen from a dry etching.

At least the etching time is modified in order to adjust the inclination of the flanks of the second electrode, formed by the etching of said second electrode.

Preferably the inclined flanks of the second electrode form an acute angle α with the plane wherein the dielectric layer mainly extends.

The step of defining comprises an etching carried out in such a way as to define the flanks of the second electrode forming the angle α with the plane wherein the dielectric layer mainly extends.

The angle α is between 10° and 80°.

The angle α is constant or not over the height of the flanks.

The dielectric layer is flat.

The ratio between the first surface S1 and the second surface S2 of the second electrode is less than 0.8. It is preferably between 0.01 and 0.25 (0.01 corresponding to l1=0.1*l2 i.e.? a reduction of 90% of l2 and 0.25 corresponding to l2=0.5*l1 i.e. a reduction of l2 of 50%).

The protruding element has a width l1 on its face in contact with the dielectric layer and has a width l2 on its face opposite that in contact with the dielectric layer, and wherein the l1 is less than l2. In other words, the protruding element comprises a first dimension of width l1 of the first surface S1 less than a second dimension of width l2 of the second surface S2.

Advantageously the ratio l1/l2 between the first dimension of width l1 and the second dimension of width l2 is less than 0.9 and is preferably between 0.1 and 0.5.

the second electrode forms a protruding element with a square or rectangular base.

the step of defining the contour of the second electrode is carried out in such a way that the contour comprises at least two adjacent inclined flanks.

the step of defining the contour of the second electrode is carried out in such a way that the contour comprises four flanks, with preferably each one of these flanks being inclined.

the step of defining the contour of the second electrode is carried out in such a way that the contour forms with the first S1 and second S2 surfaces a truncated cone.

the second surface S2 forms a tapping for the second electrode.

the protruding element has a width l1 on its first surface S1 facing the dielectric layer (300) and has a width l2 on its second surface S2, and wherein the l1 is less than l2 and wherein the ratio l1/l2 between the first dimension of width l1 and the second dimension of width l2 is less than 0.9 and is preferably between 0.1 and 0.5.

the contour of the protruding element has two adjacent flanks of which the dimensions l1 and L1 on its first surface S1 facing the dielectric layer (300) satisfy the following ratio: $1 \leq L1/l1 \leq 5$, preferably $1 \leq L1/l1 \leq 3$, preferably $1 \leq L1/l1 \leq 2$ and preferably $1 \leq L1/l1 \leq 1.2$.

According to an embodiment L1/l1=1. The first surface is therefore square. This makes it possible to reduce the risks of subsiding of the protruding element. According to an embodiment, there are the following dimensions: 100 nm≤L2≤300 nm and 90 nm≤L1≤290 nm.

According to a particular embodiment 100 nm≤L2≤300 nm and 30 nm≤l1≤60 nm. As such the protruding element does not form a line. This makes it possible to facilitate the manufacture of the protruding element by reducing the risks of deformation or collapse of the protruding element.

the protruding element has a length L1 on its face in contact with the dielectric layer (300) and has a length L2 on its face opposite the in contact with the dielectric layer (300), and wherein the L1 is less than L2.

the surface S1 has a polygon shape, preferably rectangular or square or has a circular shape.

The protruding element has a length L1 on its face in contact with the dielectric layer and has a length L2 on its face opposite that in contact with the dielectric layer, and wherein the L1 is less than L2. In other words, the protruding element comprises a first dimension of length L1 of the first surface S1 less than a second dimension of length L2 of the second surface S2.

The protruding element has a length L1 on its face in contact with the dielectric layer and has a width L2 on its face opposite that in contact with the dielectric layer, and wherein the L1 is less than L2.

Advantageously the ratios mentioned hereinabove concerning l1 and l2 are equal to the ratios concerning L1 and L2.

Advantageously the ratios mentioned hereinabove concerning l1 and l2 are equal to the ratios concerning L1 and L2.

The second electrode has a first face facing the dielectric layer and preferably in contact with the dielectric layer and a second face opposite the first face. An electrically conductive element such as a metal element is arranged on the second face.

The step of defining the contour of said second electrode comprises an etching at least partially in the thickness of the dielectric layer. This step of etching can contribute to minimizing l1 a little more; as such, there is a HfO$_2$/Second electrode (Ti 10 nm+TiN 50 nm) stack, the chemical etchings used to etch the layer of HfO$_2$ are not selective with respect to Ti and to TiN. By etching the layer of HfO$_2$ whether partially or not, the second electrode will continue to be etched.

The second electrode forms a protruding element with a polygon base.

The second electrode forms a protruding element with a circular base.

The deposition of the second electrode is carried out as solid plate.

The step of defining the contour of the second electrode comprises a lithography in order to define the pattern of the second electrode, preferably a deep ultraviolet lithography.

After the step of forming the second electrode, a dielectric layer is deposited at least on the flanks and the second surface of the protruding element forming the second electrode and on the dielectric layer, the deposition of the dielectric layer preferably being a conformal deposition.

Preferably, the dielectric layer is an oxide layer. Alternatively it can be formed by another layer.

After the forming of the dielectric layer, a step of planarizing said dielectric layer carried out by a chemical-mechanical polishing. The planarization is carried out by a chemical-mechanical polishing, the etching makers it possible to lower the height of the layer 500. Preferentially, the step of planarizing is followed by a step of etching in order to "lower" the level of oxide. However, it is also possible to use only a step of chemical-mechanical polishing (having in this case, the primary purpose of planarizing the surface but also of lowering the dielectric height).

Preferentially, in said dielectric layer, a passage is formed in order to access the second electrode (via).

the passage is at least partially filled with a conductive material in such a way as to form a tapping for the second electrode. Alternatively, it is also possible to lower the level of the dielectric until on the memory point, then to deposit a conductive material, and to etch it in order to delimit the tapping zone.

A dielectric layer is positioned at least on the flanks and the second surface of the protruding element forming the second electrode and on the dielectric layer.

Preferentially, in said dielectric layer is formed a passage in order to access the second electrode.

The passage is, at least partially, filled with a conductive material in such a way as to former a tapping for the second electrode.

The contour of the protruding element forming the second electrode is a trapeze of which the side facing the dielectric layer is smaller than the side opposite the dielectric layer. This contour forms a receding trapeze.

the contour of the protruding element forming the second electrode forms a concave profile facing the plane perpendicular to a plane wherein the dielectric layer extends.

the contour of the protruding element forming the second electrode has:

two faces substantially parallel with one another and parallel to the dielectric layer flanks, preferably two pairs of flanks, joining said two substantially parallel faces, with the flanks being curved, preferably towards the inside of the protrusion. As such the flanks are not necessarily straight, they can be curved. Preferably the values of the angles α and β mentioned hereinabove come together for the two pairs of flanks.

It is specified that in the framework of this invention, the term "on" does not necessarily means "in contact with". As such, for example, the deposition of a layer on another layer, does not necessarily mean that the two layers are directly in contact with one another but this means that one of the layers covers at least partially the other by being either directly in contact with it, or by being separated from it by a film, another layer or another element.

The term "contour" means the curved or inclined wall in this invention, extending from the first surface and to the second surface. If the section of the contour taken according to a plane parallel to the dielectric layer is polygonal, the contour includes several faces, four for example if it is a square or a rectangle. If the section of the contour taken according to a plane parallel to the dielectric layer is circular and the protruding element therefore forms a truncated cone, then the contour has a continuous face, or an infinity of faces.

The expression the zone of the element A is located "next to" or "facing" the element B means that the zone of the element A and the element B are superimposed, in direct contact or not, according to a direction perpendicular to the main plane wherein the dielectric layer extends.

The memory cell according to this invention comprises micronic and/or nanometric dimensions. The description that follows has for preferred purpose to present a memory cell and the method of manufacture thereof in reference to FIGS. 1 to 5.

FIG. 1 shows a memory cell comprising a dielectric layer 300 arranged between a first electrode 100 and a second electrode 200. Preferably, the dielectric layer 300 is an oxide layer. Alternatively it can be formed by another layer. Preferably, the dielectric layer 300 is flat. Preferably, first the first electrode 100 is formed, then the dielectric layer 300 is deposited on the first electrode 100, and finally the second electrode 200 is formed on the dielectric layer 300. According to a particularly advantageous embodiment, at least one layer but preferentially all of the layers forming the first electrode 100, the second electrode 200 and the dielectric layer 300 are arranged in solid plate, in other words over the entire surface. Preferably, the depositions are conformal.

Preferentially, the first electrode 100 can be formed from a material, for example, chosen from Platinum (Pt), titanium nitride (TiN), or tantalum nitride (TaN). According to a non-limiting embodiment of the invention, the first electrode 100 can be formed from a stack of layers comprising, for example, successively, a layer of titanium (Ti) with a thickness of 10 nanometers (nm), a layers with a copper and aluminum (AlCu) alloy base with a thickness of about 440 nm, a layer of titanium (Ti) with a thickness of 10 nm and a layer of titanium nitride (TiN) with a thickness of 40 nm.

Preferentially, the second electrode 200 can be formed from a material with a base of titanium (Ti), tantalum (Ta), hafnium (Hf), zirconium (Zr), for example. According to an embodiment, the second electrode 200 is formed from a stack of layers comprising, for example, a layer of titanium 201 and a layer of titanium nitride 202.

The dielectric layer 300 is more preferably chosen from a metal oxide, for example with a base of hafnium oxide ($HfO_2$), titanium oxide ($TiO_2$), tantalum oxide ($Ta_2O_5$), Nickel oxide (NiO), Zinc oxide (ZnO) or of bilayers (for example of the $Al_2O_3/HfO_2$ type).

Figure 2:
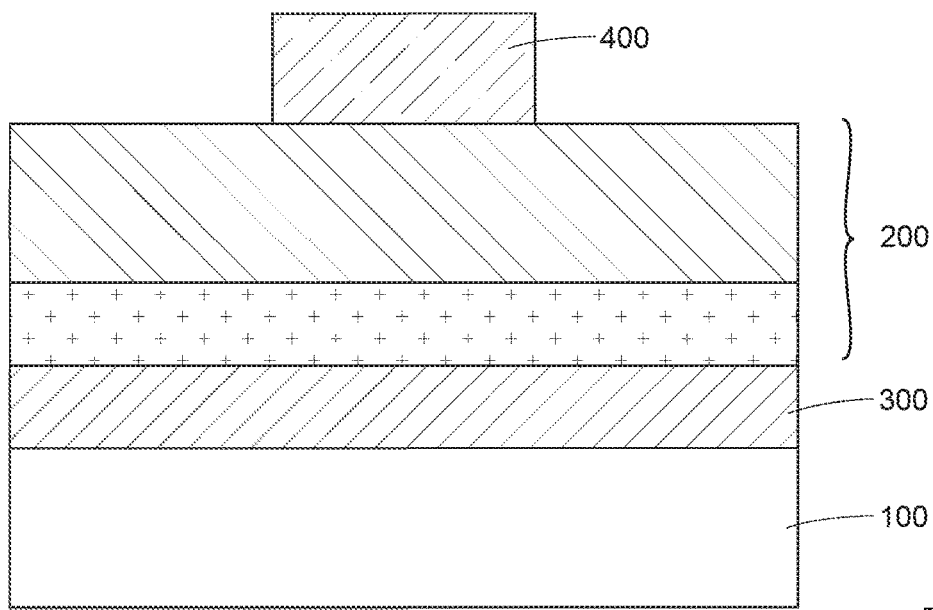
FIG. 2 shows a cross-section view of a step of lithography aiming to form a protruding element.

FIG. 2 shows a step of lithography in such a way that the second electrode 200 forms a protruding element 250 above the dielectric layer 300. The step of lithography is intended to define the patterns in the second electrode 200. According to a preferred but not limiting embodiment of the invention, the pattern will be formed by an optical or extreme photolithographic technique of the ultra-violet (UV) type or by nano-printing or electron beam ("ebeam").

According to a preferred embodiment, a lithography of the deep ultraviolet type (DUV) is used. This method has the advantage of being less expensive, more commonly used, and also faster.

The lithography comprises for example three main steps: spreading or (or coating) of a layer of resin 400 on the second electrode 200, exposition of the resin film 400 and development. The resin 400 can be of a positive or negative tonality.

According to another embodiment, a lithography is carried out, for example, by electron beam or electronic lithography, intended to define patterns in the second electrode 200; said patterns able to have a surface of about a square micrometer, and advantageously of about a hundred square nanometers. Pour dimensions exceeding 100 nm, there is no interest at all in using electron beam lithography (too long, too expensive, etc.), electron beam lithography is used to push back the limits of optical lithography and to design patterns with a resolution that can reach dimensions in the range of deca-nanometers. In order to create patterns with a low surface dimension, a layer of resin 400, more preferably "negative", is used during the electronic lithography.

FIG. 3 shows the step of defining the contour of the second electrode 200 in such a way as to former a protruding element 250.

After the step of lithography, a step of etching is carried out of the second electrode 200 in its thickness, with the purpose being to reveal a protruding element 250 forming the second electrode 200, by transfer of the pattern formed beforehand in the layer of resin 400. The protruding element 250 as such forms a punctual element at the surface of the dielectric layer 300.

The layer of resin 400 formed beforehand will make it possible to protect the zone of the second electrode 200 which will not have to be etched or which will have to be etched to a lesser degree (i.e. the top of the pattern).

The etching of the second electrode 200 is at least partially isotropic. The etching is, for example, carried out by plasma etching. It can be broken down into several steps: in a first step, the etching is "standard": it preferentially comprises a "breakthrough" step, intended to etch the surface oxide layer formed on the surface of the material 200, then is mostly anisotropic (in order to be able to effectively transfer the pattern of resin in the layer to be etched 200), and finally in the end more "chemical" in order to be able to ensure good etching selectivity in relation to a stop layer (here the dielectric layer 300). This last step is conventionally referred to as "over-etch". Usually, it is used for removing the remainder of material after etching, but it is minimized in order to not obtain "receding" profiles. In this case, the step of "over-etch" is voluntarily extended in order to laterally attack the layer defining the second electrode 200. The second electrode 200, for example made of TiN/Ti, can be etched with chemistry as Cl2/Ar or as Cl2/O2. The "over-etch" time chosen is between 10% and 90% of the time required for anisotropic etching (usually called "main-etch").

The remaining layer of resin 400 is then removed.

The protruding element 250 obtained by etching the layer 200 has, preferably, a receding "trapezoidal" shape or a concave profile. In the example shown in FIG. 3B the face of the protruding element 250 which is facing the dielectric layer has a contour polygonal, here rectangular. It is easily understood with the method described to hereinabove that in another embodiment the contour is circular. The protruding element 250 then forms a cone or rather a truncated cone that tapers while approaching the dielectric layer 300. Viewed as a cross section, this embodiment corresponds to FIG. 3A. The wall joining the two surfaces S1 and S2 is designated as contour. This wall is inclined in relation to a perpendicular to the plane containing the surface S1. This wall can be formed from a plurality of faces or from a single continuous face in the case of a truncated cone.

The protruding element comprises a first surface S1 251 facing or in contact with the dielectric layer 300 and a second surface S2 252, opposite the first S1 251. Advantageously the first surface S1 251 is less than the second surface S2 252. The surfaces S1, S2 251, 252 extend perpendicularly to the thickness of the dielectric layer 300.

More preferably the ratio S1/S2 between the first surface S1 251 and the second surface S1 252 of the protruding element 250 of the second electrode 200 is less than 0.8 and is between 0.01 and 0.25.

Figure 3A:
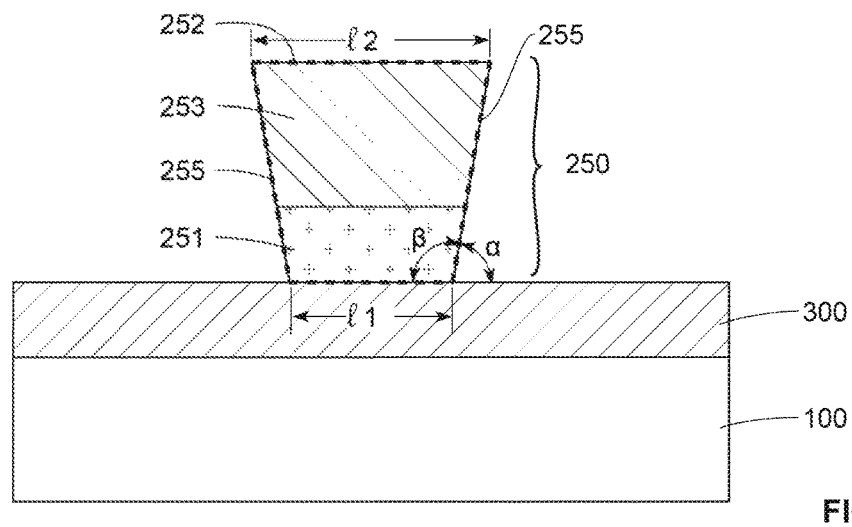
FIG. 3A shows a cross-section view of the protruding element forming one of the electrodes.
Figure 3B:
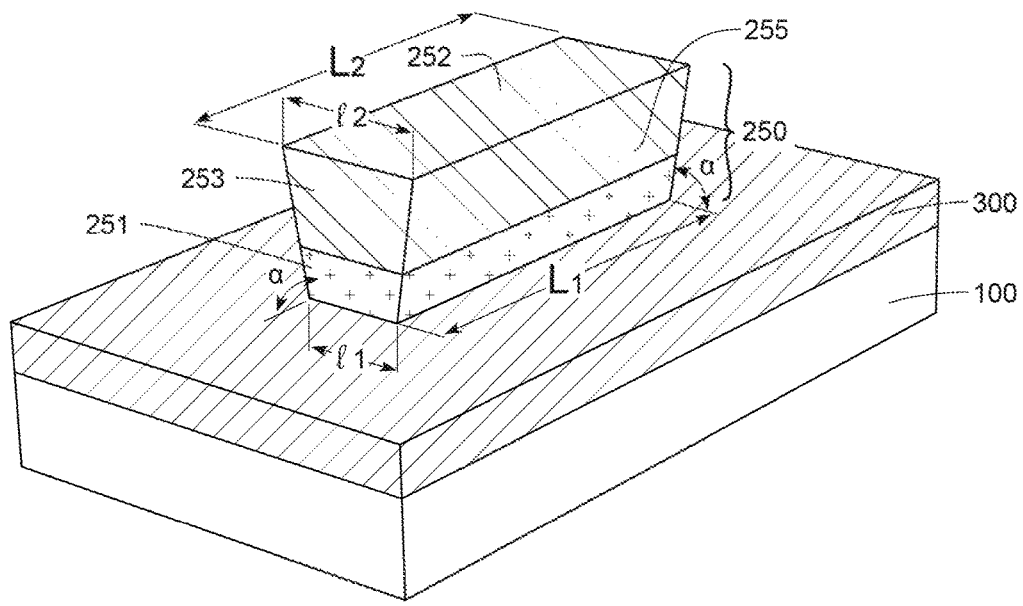
FIG. 3B shows a perspective view of the protruding element forming one of the electrodes.

The protruding element 250, when the base thereof forms a rectangle as in the non-limiting embodiment shown in FIG. 3B, comprises a first dimension of width l1 of the first surface S1 251 less than a second dimension of width l2 of the second surface S2 252. The ratio between the first dimension of width l1 and the second dimension of width l2 is between 0.1 and 0.9, and preferentially between 0.1 and 0.5.

Particularly advantageously, the flanks 255 of the protruding element 250 of the second electrode 200 are curved or inclined. The angle α between the flanks 255 of the second electrode 200 forms an acute angle with the plane wherein the dielectric layer 300 extends. The flank 255 has an outer face turned outwards from the protruding element 250 and an inner face, with the latter defining the space occupied by the protruding element 250.

Due to the inclination of the flank 255, the outer face of the flank 255 is turned facing the upper face of the dielectric layer 300. The angle α is formed between the outer face of the flank and the upper face of the dielectric layer 300. An angle β is formed between the inner face of the flank and the upper face of the dielectric layer 300. The angles α and β advantageously form complementary angles (the sum of their measurement is 180 degrees). The angle α is, preferably, between 10° and 80°. The angle α is constant or can on the contrary vary over the height of the flank.

In order to create a concave profile of the protruding element 250 and in particular favor the formation of inclined flanks 255, a standard etching with specific over-etching is preferably required. To do this, a gravure standard is carried out comprising an over-etching of the second electrode in such a way as to former a protruding element of which the profile is substantially concave or receding trapezoidal. This approach forming inclined flanks, is not standard.

Indeed, in the known methods of manufacturing microelectronic devices, it is generally sought to obtain profiles that are as straight as possible or with an "extending" slope (so that the depositions carried out afterwards are conformal). In order to obtain a vertical profile, the over-etching is usually minimized and is used only for removing the remainder of the material after etching. The over-etching is primarily chemical and gives highly isotropic profiles in the case of greatly extended etching time.

In the framework of this invention, at least the over-etching time is advantageously modified in order to adjust the inclination of the flanks 255 (i.e. the angle α) of the protruding element 250, formed by etching the second electrode 200. More exactly, the ratio between the etching time of the over-etch and the anisotropic etching time (also called "main-etch") is made to vary. This reverts to adjusting the ratio between the ionic bombarding and the dissociation of the ions in the plasma, or on the relationship: coil power electrode power.

The over-etch time chosen is between 10% and 90% of the time required for the anisotropic etching (usually referred to as "main-etch"). According to an embodiment, the step of defining the contour of said second electrode 200 comprises an at least partial etching in the thickness of the dielectric layer 300. This step of etching can contribute to minimizing l1 a little more; as such, on a HfO2/Second Electrode (Ti 10 nm+TiN 50 nm) stack, the etching chemistries used to etch the layer of HfO2 are not selective in relation to Ti and to TiN. By etching the layer of HfO2 partially or not, the second electrode 200 will continue to be etched.

Advantageously, the protruding element 250 has, in addition to the pair of flanks 255, another pair of flanks 253 that extend between the faces of the protruding element 250 which are parallel to the layer 300. Advantageously these flanks 253 have the same inclination or the same curvature as the flanks 255. The inclination or the curvature of the flanks 253 is formed during the same steps as the inclination or the curvature of the flanks 255.

As shown in FIG. 3B, the length L1 of the first surface S1 251 the protruding element 250 is less than the length L2 of the second surface S2 252. The ratios concerning the lengths L1 and L2 are more preferably equal to the ratios mentioned in this description concerning the widths l1 and l2.

If the etching to obtain the inclination of the contour of the protruding element is isotropic, the difference in length l2-l1 will be equal to the difference in length L2-L1. More preferably, the second surface S2 252 is in contact with a metal element in order to ensure the electric tapping with the electrode 200.

As shown in FIG. 3B for example, the protruding element 250 does not form a long line but a punctual electrode. As such, $1 \leq L1/l1 \leq 5$, more preferably $1 \leq L1/l1 \leq 2$, more preferably $1 \leq L1/l1 \leq 1.5$.

According to an advantageous embodiment more preferably $1 \leq L1/l1 \leq 1.2$ and $L1=l1$. This makes it possible to reinforce the mechanical resistance of the protruding element 250. For example 100 nm≤L1≤300 nm ($10^{-9}$ meters). For example 30 nm≤l1≤60 nm ($10^{-9}$ meters).

According to another embodiment, L2=100 nm, l2=50 nm, L1=80 nm and l1=30 nm.

According to another embodiment, L2=100 nm, l2=100 nm, L1=60 nm and l1=60 nm.

With these dimensions the stability of the HRS and LRS states is greatly increased, the tapping on the upper face of the protruding element 250 is facilitated and the method of manufacture is facilitated due to the fact that the mechanical resistance of the protruding element is reinforced.

Figure 4:
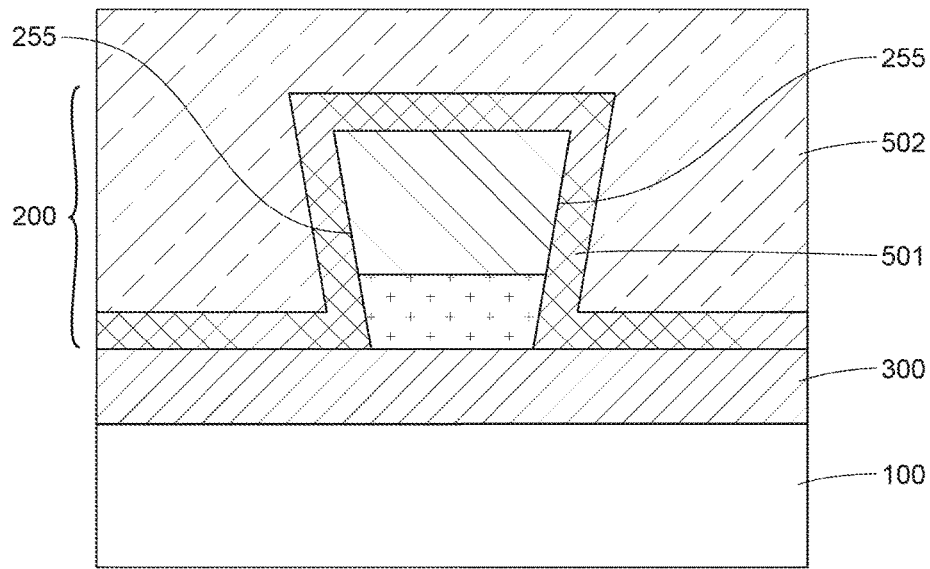
FIG. 4 shows a cross-section view of a step of deposition of a dielectric layer covering the protruding element.

FIG. 4 shows a step of forming a dielectric layer 500, after the step of formation of the protruding element 250 formant the second electrode 200. The dielectric layer 500 is carried out in such a way as to cover, more preferably, all of the memory cell and at least the protruding element 250 and the dielectric layer 300.

Preferentially, the dielectric layer 500 comprises an insulating material, for example chosen from silicon oxide (SiO2), silicon nitride (SiN), silicon carbide (SiC). According to an embodiment the dielectric layer 500 comprises a single layer, for example with a silicon oxide base. According to another embodiment shown in FIG. 4, but not limiting of the invention, the dielectric layer 500 is formed from a bilayer of which a first layer 501, for example, of silicon nitride with a thickness of 30 nanometers and a second layer 502, for example, of silicon oxide with a thickness of 300 nanometers. The deposition of SiN is done for example by using a chemical deposition technique in vapor phase assisted by plasma (acronym PECVD for "Plasma Enhanced Chemical Vapor Deposition"). Preferably the deposition of the first layer 501 is a conformal deposition. The second layer 502 forms an encapsulation layer that encapsulates the second electrode 200 and the first layer 501. This encapsulation layer makes it possible to protect the flank of the contour, for example from oxidation. Moreover, this encapsulation layer makes it possible to mechanically maintain the protruding element, especially when the ratio L1/l1 is high.

The thickness of the dielectric layer 500 is between 50 nm and 500 nm, more preferably about 300 nm. This thickness depends on the maximum height of the protruding element 250, in other words on the thickness of the second electrode 200, initially deposited.

Advantageously, the possibility of a deposition of the dielectric layer 500 is feasible, even on substantial dimension reductions (up to 10 nanometers at the foot of the protruding element 250.

Figure 5:
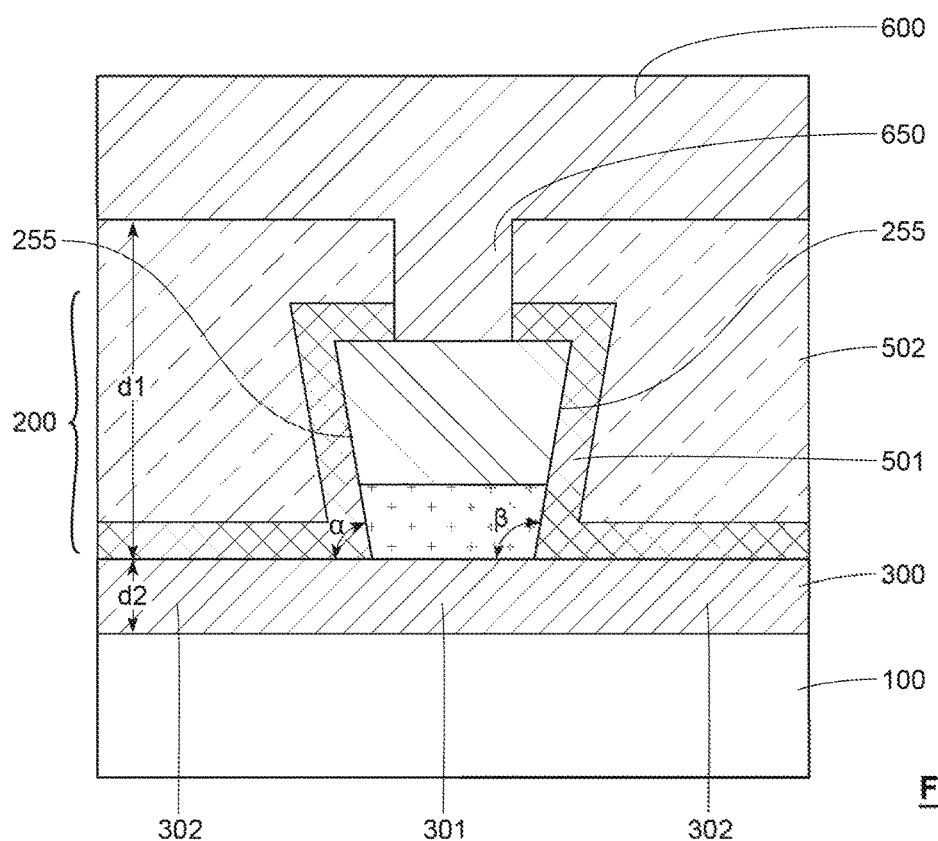
FIG. 5 shows a cross-section view of a step of forming a tapping on the electrode formed by the protruding element.

FIG. 5 shows a step of producing a tapping 600 from the protruding element 250 forming the second electrode 200. In order to carry out such a tapping 600, optionally a step of planarizing is carried out of the dielectric layer 500 in order to flatten the surface of said dielectric layer 500. According to an embodiment, the planarization is carried out by a chemical-mechanical polishing. This initial planarization can be continued by a chemical-mechanical polishing or, preferentially, by an etching, more preferably but not in a limiting manner, by dry method. More preferably, this chaining of steps is carried out in such a way as to leave a thickness for the dielectric layer 500 that remains higher than the thickness of the second electrode 200 initially deposited (i.e. the height of the protruding element 250). This thickness is taken in relation to the reference of the oxide layer 300.

A passage 650 (commonly referred to as a via) is then formed in said dielectric layer 500 in such a way as to former an access to the protruding element 250, forming the second electrode 200. To do this, a step of standard lithography is carried out in such a way as to former a pattern in the dielectric layer 500. A step of etching of said dielectric layer 500 then follows in such a way as to former the access to the second electrode 200. Advantageously, the dielectric layer 300 remains protected by the remaining dielectric layer 500 and is not modified (in terms of composition, potential oxidation) by technological steps (etching, stripping, polishing, etc.) and therefore retains its integrity.

Once the passage 650 is formed in the dielectric layer 500 giving a direct access to the second electrode 200, via the protruding element 250, a step of filling said passage 650 is carried out by a conductive material in such a way as to former a tapping 600 on the memory point. According to an embodiment, the conductive material forming the tapping 600 for the second electrode 200 comprises a material with a base of titanium (Ti), tantalum (Ta), aluminum (Al), copper (Cu), tungsten (W) for example. This filling material can be constituted of a layer or of several layers. Alternatively, it is also possible to lower the level of the dielectric layer 500 to the memory point, then a deposition of a conduction material (nature of the material specified hereinabove) and to etch it in order to delimit the tapping zone.

Advantageously, for this type of memory cell, the tapping 600 on the second electrode 200 and also on the first electrode is facilitated since the electrodes 100, 200 retain wide surfaces.

The memory cell shown in FIG. 5 comprises a first zone 301 where the first and second electrodes 100, 200 are separated by a distance d1, corresponding to the thickness of the dielectric layer 300 initially deposited on the first electrode 100. The memory cell comprises a second zone 302 where the first and second electrodes 100, 200 are separated by a distance d2 corresponding to the thickness of the dielectric layer 300 initially deposited on the first electrode 100 to which is added the thickness of the dielectric layer 500, more preferably, electrically isolating. The distance d1, as the distance d2 described in what follows, are measured according to a direction perpendicular to the main plane wherein the dielectric layer 300 extends. In the figures, this direction is vertical. The distance d1 corresponds to the shortest distance separating the first and second electrodes 100, 200 in the first zone 301. The distance d2 corresponds to the shortest distance separating the first and second electrodes 100, 200 in the second zone 302.

Thanks to this delimitation of a first zone 301 and of a second zone 302 in the dielectric layer 300, delimitation advantageously made possible by the formation of the protruding element 250, it is possible to confine the conductive filaments in a specific zone (i.e. the first zone 301) of said dielectric layer 300 which potentially makes it possible to reduce the dispersion of the conductive filaments. The invention as such makes it possible to reduce the cycle-after-cycle variability of the resistances of the LRS and HRS states and the variability of the programming window, as well as the cell-to-cell variability. The performances of the memory cell are not as degraded over time.

In the same way, in this invention, the surface of the second electrode 200 was reduced in such a way as to reduce the contact surface 251 between said second electrode 200 and the dielectric layer 300.

Advantageously, by reducing the contact surface between at least one electrode 100, 200 and the dielectric layer 300, the number of parasitic paths is less. The conductive filaments, possibly formed, are confined following the decrease in the contact surface between the second electrode 200 and the dielectric layer 300. The reduction in the number of parasitic paths can advantageously make it possible to further reduce the instability over time of memory cell devices and as such reduce the variability in the performance of such devices, and also minimize the dispersion of the electrical performance between the various memory cells, following the confinement of the conductive filaments in a limited zone.

A specific and non-limiting embodiment of the invention shall now be described.

According to this embodiment given for the purposes of information, the dielectric layer is an oxide layer formed from a hafnium oxide (HfO2) base with a thickness between 5 and 10 nm, the second electrode 200 is formed from a bilayer comprising a first layer 201 with a titanium base with a thickness of 10 nm and a second layer 202 with a titanium nitride base with a thickness of 50 nm and the dielectric layer 500 is formed from a bilayer comprising a first layer 501 with a silicon nitride base with a thickness of 30 nm and a second layer 502 with a silicon oxide base with a thickness of 300 nm. In this embodiment, the height of the memory point, in other words the height of the protruding element 250 (or initial thickness of the second electrode 200), is about 60 nm. For this example of a memory cell device, the critical dimension (CD) at the top of the memory point (i.e. on the second surface S2 252 of the protruding element 250) is about 100 nm while the critical dimension (CD) at the bottom of the memory point (i.e. on the first surface S1 251 of the protruding element 250) is between 10 nm and 100 nm.

This invention is not limited to the embodiments described hereinabove but extends to any embodiment that falls within the scope of the claims.

The invention claimed is:

1. A method for manufacturing a resistive memory cell from a stack of layers comprising at least one first electrode and a dielectric layer surmounting the first electrode, comprising:
at least forming a second electrode comprising:
depositing the second electrode on the dielectric layer,
defining a contour of said second electrode to cause the second electrode to form a protruding element above the dielectric layer and having a contour that is entirely inclined in relation to a plane perpendicular to a plane in which the dielectric layer mainly extends or curved to cause the protruding element to define a first surface S1 in contact with the dielectric layer and a second surface S2, opposite the first surface, an area of the first surface S1 being less than an area of the second surface S2; and
said surfaces S1, S2 extending substantially parallel to the plane in which the dielectric layer mainly extends,
wherein protruding element has a first cross-section and a second cross-section, the first and second cross-sections defining polygonal shapes having two opposite faces parallel to the plane in which the dielectric layer mainly extends and two opposite faces that are curved or inclined in relation to a direction that is perpendicular to the plane in which the dielectric layer mainly extends.

2. The method according to claim 1, wherein the defining of the contour of the second electrode comprises at least one etching to define flanks of the second electrode, with the etching being carried out according to a dimension in thickness of the second electrode.

3. The method according to claim 2, wherein the etching is at least partially isotropic.

4. The method according to claim 1, wherein an area ratio S1/S2 between the first surface S1 and the second surface S1 of the second electrode is less than 0.8.

5. The method according to claim 1, wherein the defining of the contour of the second electrode includes forming flanks of the second electrode that form an acute angle α with the plane in which the dielectric layer mainly extends and wherein the acute angle α is between 10° and 80°.

6. The method according to claim 1, wherein the defining of the contour of the second electrode includes defining the contour to include four flanks, with each one of the four flanks being inclined.

7. The method according to claim 1, wherein the protruding element has a width l1 on its first surface S1 facing the dielectric layer and has a width l2 on its second surface S2, and wherein the l1 is less than l2 and wherein a ratio l1/l2 between a first dimension of width l1 and a second dimension of width l2 is less than 0.9.

8. The method according to claim 1, wherein the contour of the protruding element has two adjacent flanks of which the dimensions l1 and L1 on its first surface S1 facing the dielectric layer satisfy a following ratio: 1≤L1/l1≤5.

9. The method according to claim 1, wherein the defining of the contour of the second electrode includes defining the contour to form, with the first S1 and second S2 surfaces, a truncated cone.

10. The method according to claim 1, wherein the depositing of the second electrode includes depositing the second electrode as a contiguous layer or plate.

11. The method according to claim 1, wherein the defining of the contour of the second electrode comprises at least one lithography in order to define a pattern of the second electrode, more preferably a deep ultraviolet lithography.

12. The method according to claim 1, wherein, after said forming the second electrode, the method includes depositing another dielectric layer at least on flanks of the second electrode and the second surface S2 of the protruding element forming the second electrode and on the other dielectric layer, with the deposition of the other dielectric layer being a conformal deposition.

13. The method according to claim 12, comprising, after the forming of the other dielectric layer, planarizing said other dielectric layer carried out via a chemical-mechanical polishing.

14. The method according to claim 12, wherein, in said other dielectric layer, a passage is formed in order to access the second electrode.

15. The method according to claim 1, wherein said second electrode has an inverted-trapezoid cross section.

16. The method according to claim 1, wherein said first cross-section and said second cross-section are in planes that are orthogonal to each other.

17. A memory cell comprising:
a stack of layers comprising:
a first electrode,
a second electrode, and
a dielectric layer positioned between the first electrode and the second electrode,
wherein the second electrode forms a trapezoidal protruding element above the dielectric layer having flanks inclined in relation to a plane perpendicular to a plane in which the dielectric layer mainly extends or curved in such a way that the protruding element defines a first surface S1 in contact with the dielectric layer and a second surface S2, opposite the first surface, and area of the first surface S1 being less than an area of the second surface S2;
said surfaces S1, S2 extending substantially parallel to the plane wherein the dielectric layer mainly extends,
wherein protruding element has a first cross-section and a second cross-section, the first and second cross-sections defining polygonal shapes having two opposite faces parallel to the plane in which the dielectric layer mainly extends and two opposite faces that are curved or inclined in relation to a direction that is perpendicular to the plane in which the dielectric layer mainly extends.

18. The memory cell according to claim 17, wherein an area ratio S1/S2 between the first surface S1 and the second surface S1 of the second electrode is less than 0.8.

19. The memory cell according to claim 17, wherein oblique or inclined flanks form an acute angle α with the plane wherein the dielectric layer mainly extends and wherein the angle α is between 10° and 80°.

20. The memory cell according to claim 17, wherein the protruding element has a width l1 on its face in contact with the dielectric layer and has a width l2 on its face opposite that in contact with the dielectric layer, and wherein the l1 is less than l2 and wherein a ratio l1/l2 between a first dimension of width l1 and a second dimension of width l2 is less than 0.9.

21. The memory cell according to claim 17, comprising another dielectric layer positioned at least on flanks of the second electrode and the second surface S2 of the protruding element formed by the second electrode and on the other dielectric layer.

22. The memory cell according to claim 17, wherein the contour of the protruding element forming the second electrode forms a concave profile with regards to the plane perpendicular to a plane in which the dielectric layer extends.

23. A microelectronic device comprising a plurality of memory cells according to claim 17.

* * * * *